(12) United States Patent
Narasimha et al.

(10) Patent No.: US 7,318,208 B2
(45) Date of Patent: Jan. 8, 2008

(54) METHOD FOR CIRCUIT SENSITIVITY DRIVEN PARASITIC EXTRACTION

(75) Inventors: Usha Narasimha, Dallas, TX (US); Anthony M. Hill, Dallas, TX (US); Nagaraj Narasimh Savithri, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 324 days.

(21) Appl. No.: 11/251,722

(22) Filed: Oct. 17, 2005

(65) Prior Publication Data

US 2006/0085776 A1    Apr. 20, 2006

Related U.S. Application Data

(60) Provisional application No. 60/619,845, filed on Oct. 18, 2004.

(51) Int. Cl.
*G06F 17/50* (2006.01)

(52) U.S. Cl. ............................................. 716/5; 716/6
(58) Field of Classification Search ...................... None
See application file for complete search history.

(56) References Cited

U.S. PATENT DOCUMENTS 5,402,357 A *  3/1995  Schaefer et al. ............. 716/12
5,638,294 A *  6/1997  Sasada ........................... 716/5
6,286,126 B1 *  9/2001  Raghavan et al. ............. 716/6
6,463,567 B1 * 10/2002  Kozai ............................. 716/2
6,751,744 B1 *  6/2004  Allen et al. .................. 713/401
6,772,404 B2 *  8/2004  Tanaka ......................... 716/10
7,103,863 B2 *  9/2006  Riepe et al. ................... 716/7

* cited by examiner

*Primary Examiner*—Leigh M. Garbowski
(74) *Attorney, Agent, or Firm*—Robert D. Marshall, Jr.; W. James Brady; Frederick J. Telecky, Jr.

(57) ABSTRACT

The method of this invention determines the timing of an integrated circuit design. At each node, the method determines if the timing of signal propagation at that node is critical. If this timing is critical, method calculates the capacitance at said current node using a highly accurate but computationally intensive model. If this timing is not critical, the method uses a less accurate but less computationally intensive model. The method calculates a signal delay for each node from the drive strength, calculated capacitance and fan-out. This signal delay is compared to a design goal. This method achieves a better trade-off between timing determination run-time and accuracy. Timing criticality can be determined from one or more of conductor length/area, fan-out, logic depth and timing slack.

9 Claims, 2 Drawing Sheets

METHOD FOR CIRCUIT SENSITIVITY DRIVEN PARASITIC EXTRACTION

CLAIM OF PRIORITY

This application claims priority under 35 U.S.C. 119(e)(1) from U.S. Provisional Application 60/619,845 filed Oct. 18, 2004.

TECHNICAL FIELD OF THE INVENTION

The technical field of this invention is microelectronic design tools and especially the use of parasitic capacitance extraction.

BACKGROUND OF THE INVENTION

The design very high speed and high precision integrated circuits involves many design choices and trade-offs. One of the most difficult tasks in integrated circuit design is timing closure. Achieving timing closure means that all the parts of the integrated circuit generate their outputs in time for proper operation of the next circuit. The rise time on a signal line varies directly with the drive capacity of the driving circuit. The drive capacity typically varies directly with the channel width of the driving transistors. This rise time varies inversely with the capacitance driven. The driven capacitance includes the gate capacitance of the inputs of the driven circuits and the wire capacitance of all wires of the signal line.

Most of these quantities are under control of the integrated circuit designer or can be easily estimated. The driving circuit channel width and thus the drive strength are directly specified by the integrated circuit design. Likewise the driven gate capacitance is controlled by the design selected. The designer has direct control over the fan-out. Fan-out is the number of inputs driven by that signal line. The respective gate capacitances of the driven inputs correspond to the particular circuit selected for each input device. Thus this factor is easily estimated. The wire capacitance is not so easily estimated. The wire capacitance depends primarily upon the length of the signal line. This signal line capacitance can also be estimated. However, the wire capacitance generally includes a considerable proportion of parasitic capacitance. Parasitic capacitance consists of capacitance between the signal line and other structures not normally considered in estimating capacitance. These other structures include other signal lines on the same metal layer, lines on other metal layers and other structures that contribute to capacitance. Parasitic capacitance varies widely and can be particularly difficult to estimate in current designs with multi-level metal and large numbers of crowded structures.

There are a number of commercial parasitic calculation tools available to the integrated circuit designer. The integrated circuit designer is faced with two choices in using these tools. First, the designer can use the parasitic capacitance calculation tool to accurately calculate the parasitic capacitance of each network node in the circuit. This selection typically requires a large amount of computation and is thus typically very slow. Second, the designed can use the parasitic capacitance calculation tool using a lower accuracy. This selection will yield answers in a timely manner. However, there is no guarantee that these parasitic capacitance calculations will correctly predict the actual circuit behavior.

SUMMARY OF THE INVENTION

This invention uses variable accuracy parasitic capacitance extraction based on circuit sensitivity. Instead of blindly extracting the parasitic capacitance of every net to a specified degree of accuracy, the invention extracts critical nets to high degree of accuracy and non-critical nets to a lower degree of accuracy. This invention is a smart way to trade off accuracy versus runtime. Not all nets are critical in any design. Only the critical nets need to be extracted to high degree of accuracy.

This invention ensures accuracy for all types of applications, such as hold-time and setup-time in digital circuits. It is also applicable to critical parameters of interest in analog circuits. Implementing this method helps guarantee meeting circuit performance goals.

BRIEF DESCRIPTION OF THE DRAWINGS

These and other aspects of this invention are illustrated in the drawings, in which.

DETAILED DESCRIPTION OF PREFERRED EMBODIMENTS

Historically most parasitic capacitance extraction tools use a capacitance accuracy metric. Thus the tool could operate to ensure accuracy within ±5% of the actual silicon capacitance or a reference extraction, such as Quickcap 3-D field solver. Thus most parasitic capacitance extraction tools find it difficult to meet a reasonable accuracy versus runtime trade-off. Due to 3-D effects and process complexities such as Selective Process Bias (SPB) and dummy metal geometries, high accuracy parasitic capacitance calculation is time consuming.

Critical performance metrics for the integrated circuit design are delay and noise. These are a combined effect of circuit configuration and RC parasitics. Not all network nodes in a particular integrated circuit design need high accuracy extraction. Thus runtimes can be lowered by employing a variable accuracy extraction. Some critical network nodes will require highly accurate parasitic capacitance extraction to yield information needed to determine the critical metrics of delay and noise. Other network nodes require less accurate parasitic capacitance extraction to achieve the same accuracy in the critical metrics. Thus critical network nodes need not suffer from low accuracy extraction to achieve runtime benefits.

This invention exploits delay sensitivities to tailor accuracy needed in the parasitic capacitance extraction. The accuracy of calculation is selected based on timing uncertainty instead of capacitance uncertainty. This permits a better trade-off between runtime and accuracy. The margins due to extraction inaccuracies can be reduced.

Figure 1:
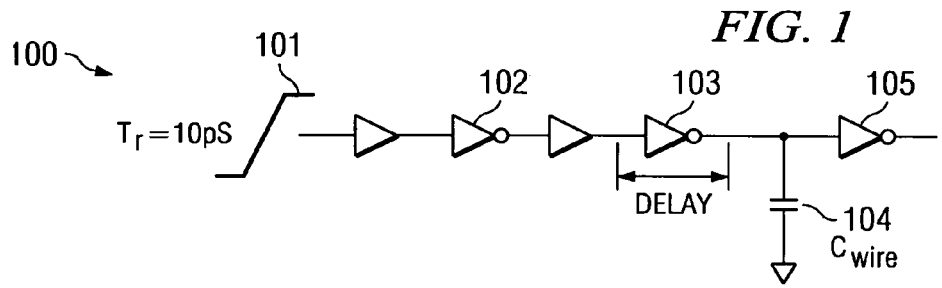
FIG. 1 illustrates a model circuit used in consideration of the parasitic capacitance extraction.

FIG. 1 illustrates model circuit 100 used in describing this invention. This example is a cell from an existing library. Circuit 100 supplies an input signal 101 $T_r$ to a set of three inverter stages 102. Three inverter stages 102 account for slew propagation. The output of three inverter stages 102 supplies the input of gate 103. Gate 103 supplies an output to fan-in gate 105 and drives wire capacitance 104 $C_{wire}$. The delay is measured across gate 103 and in the time from when the input to gate 103 crosses the threshold voltage until the output of gate 103 crosses the threshold voltage. This example model circuit 100 uses a supply voltage of 1.26 V, a strong SPICE model, −40° C. and 10 pS input transition time. Model circuit 100 shows about 0.5 pS change in delay for each 1 fF change in capacitance.

Figure 2:
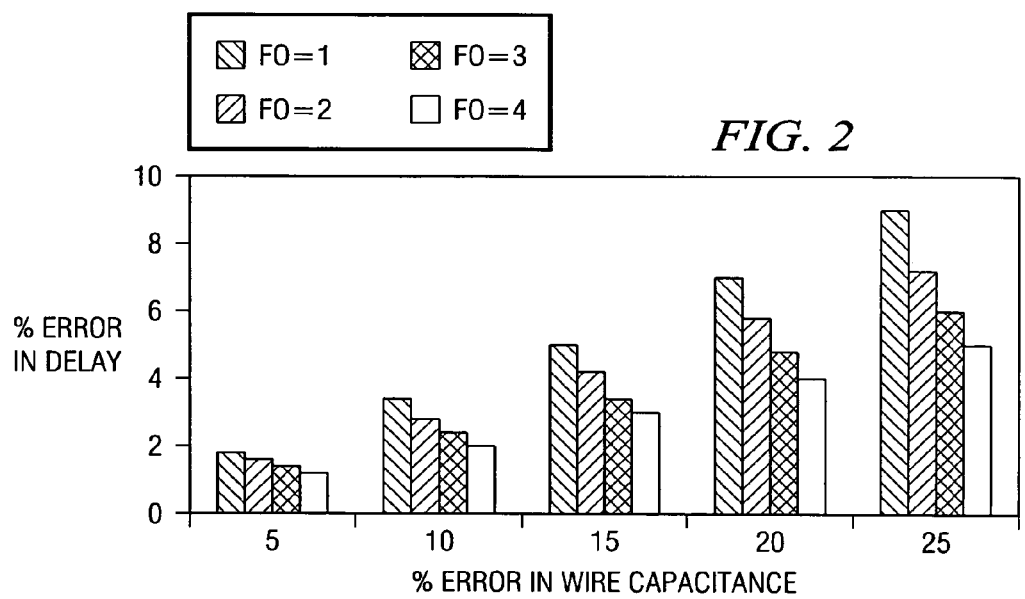
FIG. 2 illustrates the relationship between the error in calculation of wire capacitance versus error in circuit delay estimation for several fan-outs.

FIG. 2 illustrates the relationship between the error in calculation of wire capacitance versus error in circuit delay estimation for fan-outs (FO) from 1 to 4. This chart is calculated assuming a wire capacitance $C_{wire}$ of 5 fF. FIG. 2 illustrates that the sensitivity of the delay % error relative to the % error in extracting wire capacitance $C_{wire}$ is largest for a fan-out (FO) of 1 and smallest for a FO of 4 at all wire capacitance $C_{wire}$ % errors. Note further, in all cases the delay % error is smaller than the wire capacitance $C_{wire}$ % error.

Figure 3:
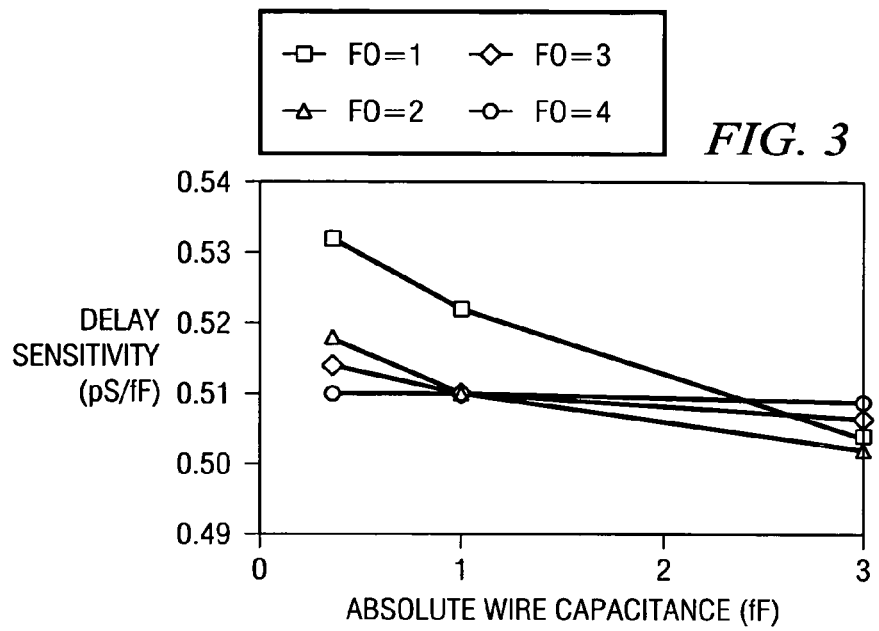
FIG. 3 illustrates the delay sensitivity versus absolute wire capacitance for several fan-outs.

FIG. 3 illustrates the delay sensitivity versus absolute wire capacitance for fan-outs (FO) from 1 to 4. FIG. 3 shows the delay sensitivity in pS/fF for absolute wire capacitance from about 0.25 fF to 3.00 fF. FIG. 3 clearly shows that the delay sensitivity is smaller for larger fan-outs. Because gate capacitance dominates for higher fan-outs, the error in delay is lower at higher fan-outs.

Figure 4:
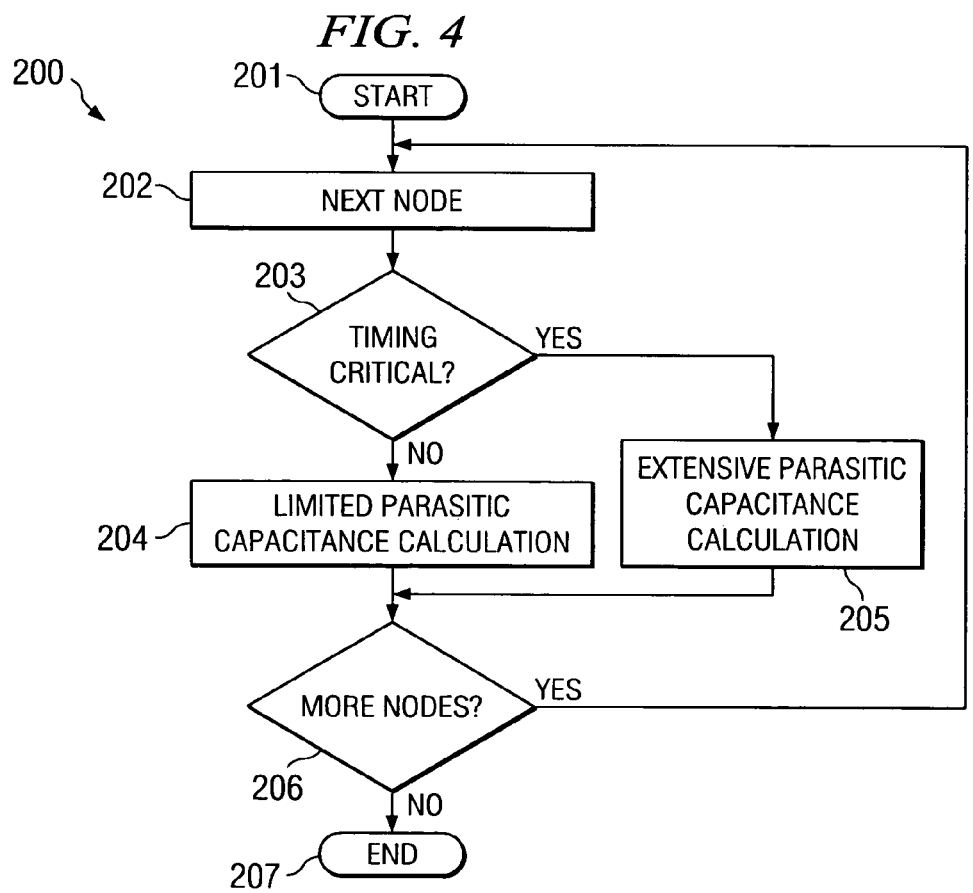
FIG. 4 is a flow chart illustrating the method of this invention.

FIG. 4 illustrates flow chart 200 showing the method of this invention. Method 200 begins with start block 201. Processing block 202 considers the next node in the netlist. Decision block 203 determines if the timing at this node is critical. There are a number of ways this determination could be made. This determination could be made on the basis of whether the length and width (area) of the metal line attached to this node exceeds a predetermined threshold. The timing is critical if the length exceeds the threshold. This determination could be made on the basis of the fan-out of the node. The timing is critical if the fan-out is less than a predetermined number. This determination could be made on the basis of the logic depth of the current node within the circuit. The logic depth of the node is the maximum number of gates a signal must travel through the current node within a single clock cycle. The timing is critical if the logic depth exceeds a predetermined number. Another criteria that could be used is timing slack. Nets with large timing slack don't need high accuracy in parasitic capacitance extraction. Nets with less timing slack are prone to cause setup/hold time issues and require greater accuracy in parasitic capacitance extraction. The inventors determined from the distribution of timing slack in the example design that about 20% of nets have slack less than 100 pS. These nets need relatively more accuracy than other nets. The absolute delay may also be an important consideration. Other determinations are possible including combinations of two or more of these criteria. In any event this determination is made on the basis of the criticality of the timing at this node rather than the criticality of the capacitance calculation. This determination can be made using either data a priori known, such as from a place and route tool which uses a fast extractor, or from data from an initial low-accuracy extraction run of the extraction tool.

If not (No at decision block 204), then method 200 performs a limited parasitic capacitance calculation. This limited calculation may consider only the metal line width and length. If so (Yes at decision block 203), then method 200 performs an extensive parasitic capacitance calculation (processing block 205). This extensive calculation is made according to the known art including consideration of the metal line dimensions and the structures adjacent to the metal line of the current node.

Once the capacitance calculation is made, decision block 206 determines if there are other nodes within the network to be considered. If so (Yes at decision block 206), then method 200 returns to processing block 202 to consider the next node. If not (No at decision block 206), then method 200 ends at end block 207. The extracted capacitance for each of the nodes enables determination of the delay of the circuits. The calculated delay permits determination of whether the circuit design meets the timing requirements at the desired clock frequency.

An equivalent resistance $R_{eq}$ for every node can be computed using conventional tools such as a Synopsys timing reports or SDF. When wire RC delay is not significant, for example for short routes, then:

$$R_{eq} = \frac{D_d}{C_d}$$

where: $R_{eq}$ is the equivalent resistance; $D_d$ is the driver delay; and $C_d$ is the capacitance driven. For example, a driver delay of 100 pS and a capacitance driven of 10 fF yields a $R_{eq}$ of $100 \times 10^{-12} / 10 \times 10^{-15}$ or 10 KΩ. When wire RC delay not significant, for example for long routes, then:

$$R_{eq} = \frac{D_d + D_{rc}}{C_d}$$

where: $D_{rc}$ is the RC delay. For example, a driver delay of 50 pS, an RC delay of 50 pS and a capacitance driven of 100 fF yields a Req of $(50+50) \times 10^{-12} / 100 \times 10^{-15}$ or 1 KΩ. Worst case timing arcs could be used to determine the equivalent resistance.

A proof-of-concept flow was explored on a design block in an integrated circuit under design by the inventors. Nets from critical paths (max delay) were run to a timing goal of 1 pS which is 3-sigma of 3 pS. Nets from critical paths (min delay) were run to a timing goal of 0.33 pS or 3-sigma of 1 pS. The results show that an ensuring capacitance error of ±5% 3-sigma may not ensure timing accuracy. The results also show that a good portion of nets may not need ±5% 3-sigma accuracy. Thus this criteria for parasitic capacitance extraction is both under inclusive and over inclusive. These tests show that the timing driven parasitic capacitance extraction of this invention improves run time about 60% over the reference ±5% 3-sigma accuracy runs.

What is claimed is:

1. A method for determining timing of an integrated circuit design comprising the steps of:

for each node of the netlist of the integrated circuit design:
determining if the timing of signal propagation at a current node is critical,
if said timing at said current node is critical, calculating the capacitance at said current node using a first model, said first model having a first accuracy and a first computation requirement,
if said timing at said current node in not critical, calculating the capacitance at said current node using a second model, said second model having a second accuracy less than said first accuracy and a second computational requirement less than said first computation requirement, calculating a signal delay for said current node from a drive strength of a circuit supplying said current node, said calculated capacitance and a fan-out of said current node, and determining if said calculated signal delay for said current node meets a design goal for said current node.

2. The method of claim 1, wherein:

said step of determining if the timing of signal propagation at said current node is critical comprises determining if an area of wires connected to said current node exceeds a predetermined area.

3. The method of claim 1, wherein:

said step of determining if the timing of signal propagation at said current node is critical comprises determining if a fan-out of said current node is less than a predetermined fan-out.

4. The method of claim 1, wherein:

said step of determining if the timing of signal propagation at said current node is critical comprises determining if a logic depth at said current node exceeds a predetermined logic depth.

5. The method of claim 1, wherein:

said step of determining if the timing of signal propagation at said current node is critical comprises determining if a timing slack at said current node is less than a predetermined timing slack.

6. The method of claim 5, wherein:

said predetermined timing slack meets a timing threshold of 100 pS.

7. The method of claim 1, wherein:

said step of determining if the timing of signal propagation at said current node is critical comprises consideration of at least two of the following: (1) area of wires connected to said current node; (2) fan-out of said current node; (3) logic depth at said current node and (4) timing slack at said current node.

8. The method of claim 1, wherein:

said first model includes consideration of an area of conductors connected to said current node and structures adjacent to said conductors connected to said current node.

9. The method of claim 1, wherein:

said second model considers only an area of conductors connected to said current node.

\* \* \* \* \*